United States Patent
Hsu et al.

(10) Patent No.: US 7,889,043 B2
(45) Date of Patent: Feb. 15, 2011

(54) ASSEMBLY STRUCTURE OF TRANSFORMER, SYSTEM CIRCUIT BOARD AND AUXILIARY CIRCUIT BOARD

(75) Inventors: Jui-Yuan Hsu, Taoyuan Hsien (TW); Hong-Jian Gan, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 0 days.

(21) Appl. No.: 12/536,943

(22) Filed: Aug. 6, 2009

(65) Prior Publication Data

US 2010/0033282 A1 Feb. 11, 2010

(30) Foreign Application Priority Data

Aug. 7, 2008 (TW) .............................. 97130083 A

(51) Int. Cl.
*H01F 5/00* (2006.01)
(52) U.S. Cl. ...................... 336/200; 336/223; 336/232
(58) Field of Classification Search ...................... None
See application file for complete search history.

(56) References Cited

U.S. PATENT DOCUMENTS

| | | | | |
|---|---|---|---|---|
| 4,639,706 A | * | 1/1987 | Shimizu | 336/170 |
| 4,661,792 A | * | 4/1987 | Watkins | 336/65 |
| 4,999,743 A | * | 3/1991 | Fontana et al. | 361/782 |
| 6,420,953 B1 | * | 7/2002 | Dadafshar | 336/200 |
| 2002/0189083 A1 | * | 12/2002 | Matsumoto et al. | 29/743 |
| 2008/0180205 A1 | * | 7/2008 | Tsai et al. | 336/192 |

* cited by examiner

*Primary Examiner*—Anh T Mai
(74) *Attorney, Agent, or Firm*—Kirton & McConkie; Evan R. Witt

(57) ABSTRACT

An assembly structure includes a transformer, a system circuit board and an auxiliary circuit board. The transformer includes a primary winding coil, a secondary winding assembly and a magnetic core assembly. The magnetic core assembly is partially embedded within the primary winding coil and the secondary winding assembly. The secondary winding assembly has multiple output ends. The system circuit board is connected to the primary winding coil. The auxiliary circuit board is connected to the system circuit board and has multiple connecting parts. The output ends of the secondary winding assembly of the transformer are connected with corresponding connecting parts of the auxiliary circuit board.

9 Claims, 6 Drawing Sheets

ASSEMBLY STRUCTURE OF TRANSFORMER, SYSTEM CIRCUIT BOARD AND AUXILIARY CIRCUIT BOARD

FIELD OF THE INVENTION

The present invention relates to an assembly structure, and more particularly to an assembly structure of a transformer, a system circuit board and an auxiliary circuit board.

BACKGROUND OF THE INVENTION

Power supply apparatuses become indispensable electronic devices for many kinds of electrical apparatuses. Nowadays, with increasing awareness of environmental protection, more and more electrical apparatuses are designed in views of power-saving concepts. Therefore, it is very important to increase the operating efficiency of the electrical apparatus. A power supply apparatus principally comprises switching elements, a magnetic element, capacitors and conductors of various resistance values. The magnetic element such as a transformer has become an essential electronic component for voltage regulation into required voltages for various kinds of electric appliances. For increasing the operating efficiency of the power supply apparatus, the loss of the magnetic element needs to be minimized. Generally, the loss of the magnetic element includes core loss, coil loss and terminal loss. The term "terminal loss" denotes the power loss generated at the soldered junction between the outlet terminal of a coil and a conductor.

FIG. 1 is a schematic perspective view illustrating a transformer and a rectifier that are mounted on a system circuit board according to the prior art. The transformer 10 and the rectifier 14 are mounted on the system circuit board 1. The rectifier 14 is located at an edge of the system circuit board 1. The outlet terminals 111 of the secondary winding coil 11 of the transformer 10 are welded on corresponding pins 12 of the system circuit board by a solder material 13. In addition, the transformer 10 is electrically connected to the rectifier 14 through a trace pattern (not shown) on the system circuit board 1. The transformer can output a sensing voltage to the rectifier 14. After the sensing voltage is rectified and filtered by the rectifier 14, a regulated DC voltage will be transmitted to a load (not shown).

Although the assembly structure of FIG. 1 is effective to provide a regulated DC voltage to the load, there are still some drawbacks. For example, since the outlet terminals 111 of the secondary winding coil 11 of the transformer 10 are welded on the pins 12 by the solder material 13, the relatively higher resistance of the solder material 13 may increase power loss of the transformer 10. In addition, since the transformer 10 is electrically connected to the rectifier 14 through the trace pattern on the system circuit board 1, the output current of the transform 10 is transmitted to the rectifier 14 through the pins 12 and the trace pattern. Since the rectifier 14 is usually located at an edge of the system circuit board 1, this very long path of the trance pattern results in additional power loss and increased leakage inductance.

Therefore, there is a need of providing an improved assembly structure of a transformer, a system circuit board and an auxiliary circuit board so as to obviate the drawbacks encountered from the prior art.

SUMMARY OF THE INVENTION

The present invention provides an assembly structure of a transformer, a system circuit board and an auxiliary circuit board, thereby reducing the power loss and the leakage inductance.

In accordance with an aspect of the present invention, there is provided an assembly structure. The assembly structure includes a transformer, a system circuit board and an auxiliary circuit board. The transformer includes a primary winding coil, a secondary winding assembly and a magnetic core assembly. The magnetic core assembly is partially embedded within the primary winding coil and the secondary winding assembly. The secondary winding assembly has multiple output ends. The system circuit board is connected to the primary winding coil. The auxiliary circuit board is connected to the system circuit board and has multiple connecting parts. The output ends of the secondary winding assembly of the transformer are connected with corresponding connecting parts of the auxiliary circuit board.

In an embodiment, the transformer further includes a bobbin having a bobbin body and a channel, and the primary winding coil is wound around the bobbin body.

In an embodiment, the secondary winding assembly is a conductive winding module including multiple conductive units. The conductive units have respective hollow portions and the output ends. The hollow portions are aligned with the channel of the bobbin such that the magnetic core assembly is partially embedded into the hollow portions of the conductive units and the channel of the bobbin.

In an embodiment, the bobbin body has multiple receiving portions for receiving the conductive units.

In an embodiment, the primary winding coil is a coil pancake.

In an embodiment, the auxiliary circuit board is vertically mounted on the system circuit board.

In an embodiment, at least one rectifier and a driving circuit are mounted on the auxiliary circuit board.

In an embodiment, the auxiliary circuit board has a conductive terminal on an edge thereof such that the auxiliary circuit board is connected to the system circuit board by the conductive terminal.

In an embodiment, the connecting parts of the auxiliary circuit board are insertion slots and the output ends of the secondary winding assembly are inserted into corresponding insertion slots.

In an embodiment, a distance between the auxiliary circuit board and the transformer is equal to or smaller than the length of the output end of the transformer.

In an embodiment, the magnetic core assembly comprises a middle portion and a leg portion, and the length of each output end of the transformer is smaller than the triple of a distance between the middle portion and the leg portion.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
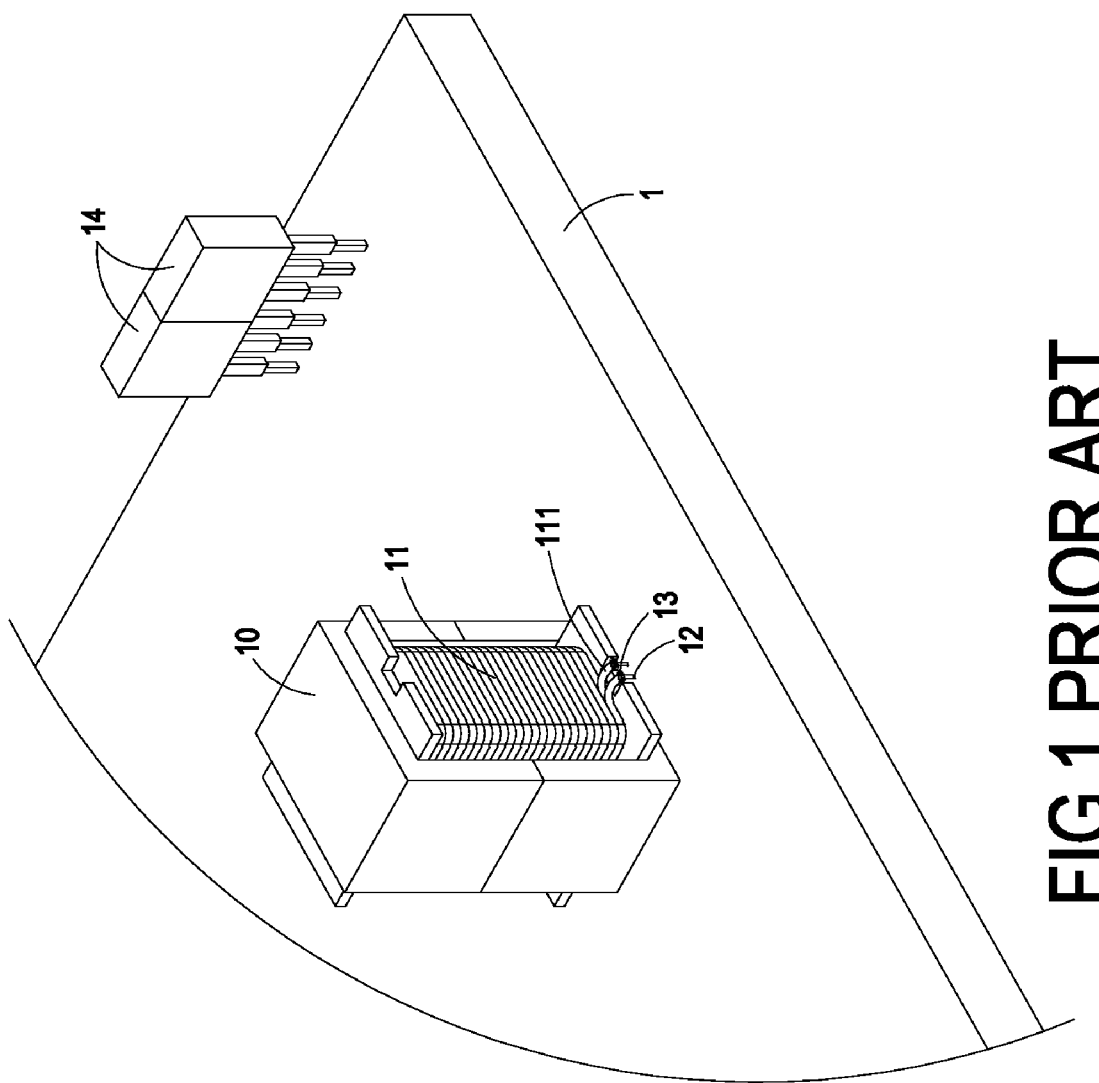
FIG. 1 is a schematic perspective view illustrating a transformer and a rectifier that are mounted on a system circuit board according to the prior art.
Figure 2:
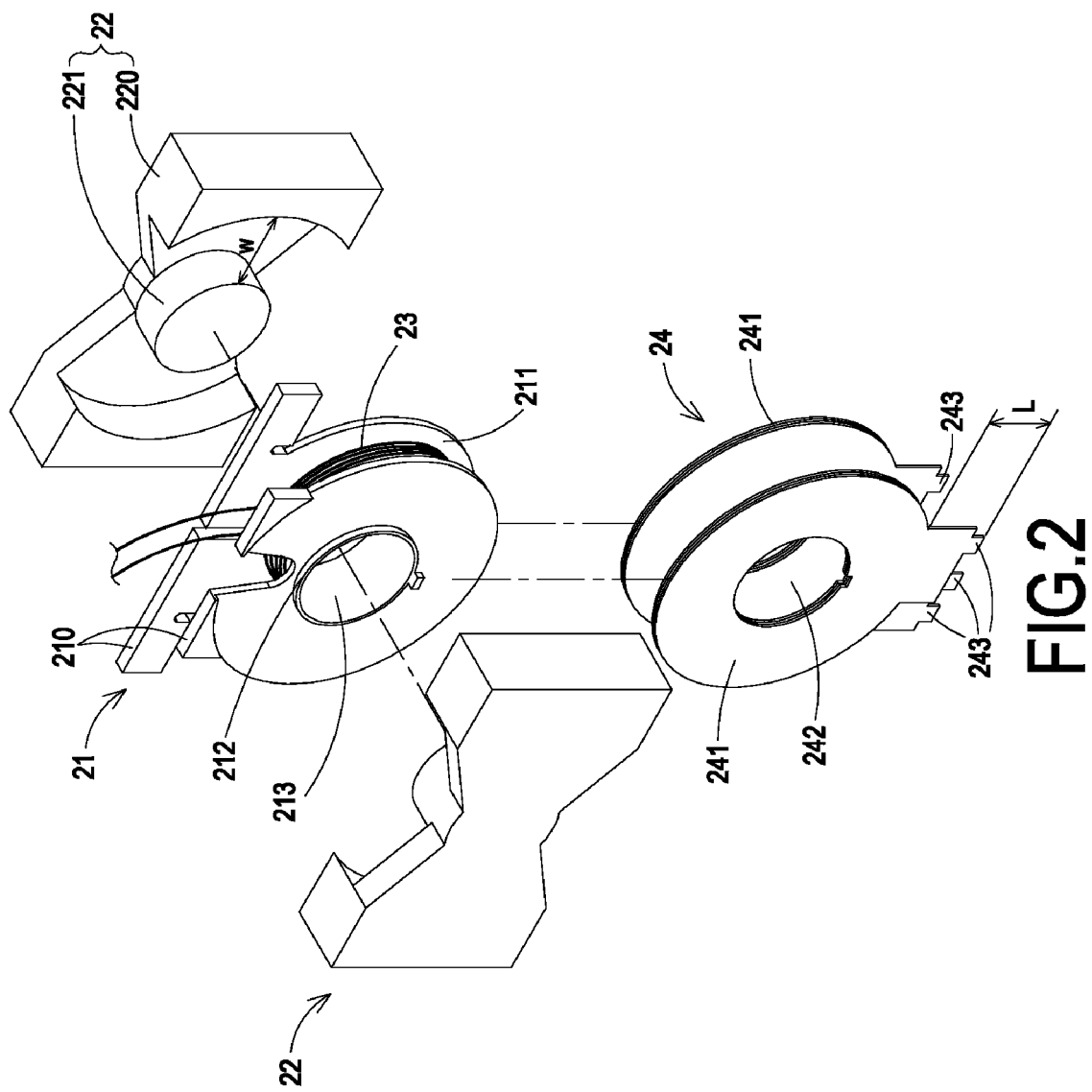
FIG. 2 is a schematic exploded view illustrating a transformer according to a preferred embodiment of the present invention.
Figure 4:
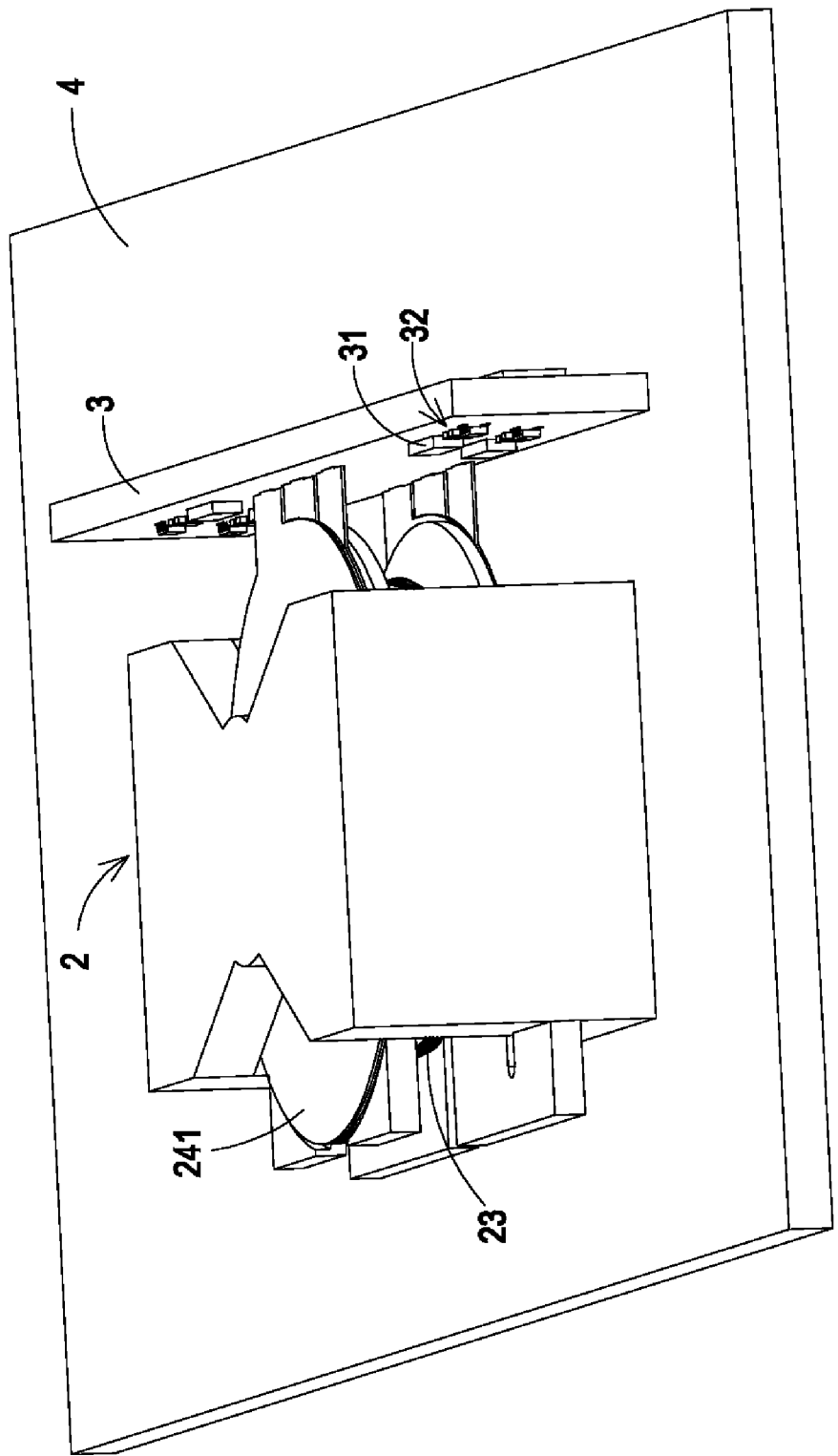
FIG. 4 is a schematic perspective view illustrating an assembly structure of the transformer and the system circuit board shown in FIG. 2 and the auxiliary circuit board shown in FIG. 3.

FIG. 2 is a schematic exploded view illustrating a transformer according to a preferred embodiment of the present invention. The transformer 2 principally includes a bobbin 21, a magnetic core assembly 22, a primary winding coil 23 and a secondary winding assembly 24. The bobbin 21 comprises a bobbin body 210, which is a substantially cylinder tube produced by a plastic injection molding process. Alternatively, the bobbin body 210 may have any shape such as a rectangular or polygonal shape. The bobbin body 210 has at least one winding portion 211 and at least one receiving portion 212. In this embodiment, the bobbin body 210 has one winding portion 211 and two receiving portions 212. These two receiving portions 212 are disposed at bilateral sides of the winding portion 211. The receiving portions 212 are substantially parallel with the winding portion 211. The numbers of the winding portions 211 and the receiving portions 212 are variable according to the practical requirements. The primary winding coil 23 is wound around the winding portion 211 of the bobbin body 210. The outlet terminals of the primary winding coil 23 are connected to a system circuit board 4 for receiving an input voltage (as shown in FIG. 4). The receiving portions 212 are used for receiving the secondary winding assembly 24. In this embodiment, the secondary winding assembly 24 is a conductive winding module. The conductive winding module 24 is composed of multiple conductive units 241. The conductive units 241 are received in corresponding receiving portions 212. Furthermore, the bobbin 21 has a channel 213 axially running through the bobbin body 210 and communicated with the receiving portions 212, so that the magnetic core assembly 22 can be partially embedded into the channel 213. The channel 213 may have an arbitrary shape. In this embodiment, the channel 213 has a circular cross-section.

Please refer to FIG. 2 again. The magnetic core assembly 22 includes two magnetic parts. In this embodiment, these two magnetic parts of the magnetic core assembly 22 are cooperatively formed as an EE-type core assembly. Each of the two magnetic parts includes a middle portion 221 and a leg portion 220. The middle portion 221 is a cylindrical post having a diameter substantially equal to the diameter of the channel 213 of the bobbin body 210, so that the middle portions 221 of the magnetic core assembly 22 can be partially embedded into the channel 213. Alternatively, the magnetic core assembly 22 may be shaped as an EI-type core assembly or any other type of core assembly.

Please refer to FIG. 2 again. The conductive winding module 24 is composed of multiple conductive units 241. Each conductive unit 241 includes multiple conductive pieces and at least one insulating piece. The insulating piece 224 is intervened between these conductive pieces. In addition, each conductive unit 241 has a central hollow portion 242 and multiple output ends 243. The output ends 243 are separately arranged on the bottom of the conductive unit 241. The length L of each output end 243 is in direct proportion to the distance W between the middle portion 221 and the leg portion 220 of the magnetic core assembly 22. In addition, the length L of each output end 243 is smaller than the triple of the distance W between the middle portion 221 and the leg portion 220.

Hereinafter, a process of assembling the transformer 2 will be illustrated with reference to FIG. 2. First of all, the primary winding coil 23 is wound around the winding portion 211 of the bobbin body 210. Next, two conductive units 241 of the conductive winding module 24 are received in the receiving portions 212, which are arranged on bilateral sides of the bobbin body 210. As such, these conductive units 241 are separated from each other by the bobbin body 210 (as shown in FIG. 4) and the hollow portions 242 of the conductive units 241 are aligned with the channel 213 of the bobbin 21. Since the diameter of the channel 213 is substantially equal to that of the hollow portion 242, the middle portions 221 of the magnetic core assembly 22 can be partially embedded into the hollow portions 242 of the conductive units 241 and the channel 213 of the bobbin 21. As a consequence, the conductive units 241 and the bobbin 21 are clamped between the leg portions 220 of the magnetic core assembly 22. The resulting structure of the transformer 2 is schematically shown in FIG. 4. The primary winding coil and the conductive winding module 24 interact with the magnetic core assembly 22 to achieve the purpose of voltage regulation. In some embodiments, after the bobbin 21, the magnetic core assembly 22 and the conductive winding module 24 are assembled into the transformer 2, an insulation tape (not shown) may be wound around the outer periphery of the transformer 2 so as to securely combine the bobbin 21, the magnetic core assembly 22 and the conductive winding module 24 together.

Figure 3:
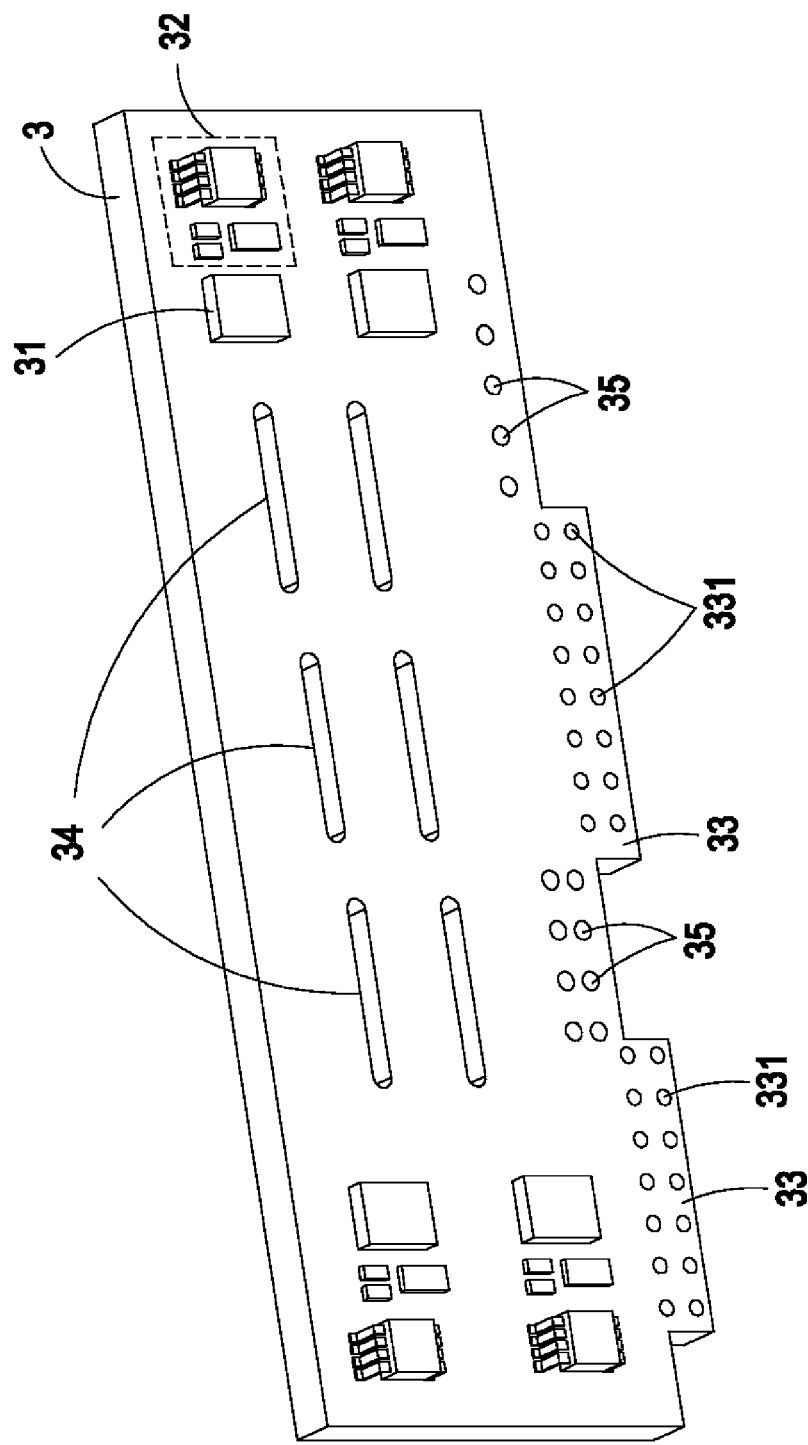
FIG. 3 is a schematic perspective view illustrating an auxiliary circuit board used in the transformer of the present invention.

FIG. 3 is a schematic perspective view illustrating an auxiliary circuit board used in the transformer of the present invention. In this embodiment, the auxiliary circuit board 3 is a multi-layered circuit board. In addition, electronic components may be arranged on both surfaces of the multi-layered circuit board. For example, several electronic components such as rectifiers 31 and driving circuits 32 are mounted on the auxiliary circuit board 3. The numbers of the rectifiers 31 and the driving circuits 32 may be varied according to the practical requirements. In addition, the auxiliary circuit board 3 has several conductive terminals 33 at an edge thereof. Corresponding to the output ends 243 of the conductive units 241 of the conductive winding module 24, the auxiliary circuit board 3 has the same number of connecting parts 34 (e.g. insertion slots). The connecting parts 34 run through both surfaces of the auxiliary circuit board 3. The output ends 243 of the conductive units 241 of the conductive winding module 24 may be inserted into corresponding connecting parts 34.

Furthermore, by inserting the conductive terminals 33 into corresponding holes (not shown) of the system circuit board 4, the auxiliary circuit board 3 will be vertically mounted on the system circuit board 4 (as shown in FIG. 4). In some embodiments, each of the conductive terminals 33 has one or more through-holes 331. During the auxiliary circuit board 3 is welded on the system circuit board 4, the molten solder material may flow into the through-holes 331 for facilitating securely fixing the auxiliary circuit board 3 on the system circuit board 4 and conducting current of different layers of the auxiliary circuit board 3 to the system circuit board 4. In some embodiments, several plated vias 35 are formed in the auxiliary circuit board 3 for facilitating transferring current among different layers of the auxiliary circuit board 3.

FIG. 4 is a schematic perspective view illustrating an assembly structure of the transformer and the system circuit board shown in FIG. 2 and the auxiliary circuit board shown in FIG. 3. Hereinafter, a process of fabricating the assembly structure of the transformer, the system circuit board and the auxiliary circuit board will be illustrated with reference to FIGS. 2, 3 and 4. First of all, the output ends 243 of the conductive units 241 of the transformer 2 are inserted into corresponding connecting parts 34 of the auxiliary circuit board 3 such that the transformer 2 is electrically connected to the rectifier 31 of the auxiliary circuit board 3. Consequently, the distance between the auxiliary circuit board 3 and the transformer 2 is equal to or smaller than the length L of the output end 243. Next, the conductive terminals 33 of the auxiliary circuit board 3 are inserted into corresponding holes (not shown) of the system circuit board 4 so that the auxiliary circuit board 3 is vertically mounted on the system circuit board 4. In addition, the outlet terminals (not shown) of the primary winding coil 23 are connected to a system circuit board 4 for receiving an input voltage. As such, a sensing voltage outputted from the transformer 2 is directly transmitted to the rectifier 31 of the auxiliary circuit board 3 so as to be rectified and filtered by the rectifier 31. Since the auxiliary circuit board 3 is vertically mounted on the system circuit board 4, the output ends 243 of the conductive units 241 of the transformer 2 can be directly inserted into corresponding connecting parts 34 of the auxiliary circuit board 3 without the need of using a solder material. Since the distance between the auxiliary circuit board 3 and the transformer 2 is equal to or smaller than the length L of the output end 243, the conductive path between the output end 243 of the conductive units 241 and the auxiliary circuit board 3 is shortened. Under this circumstance, the power loss and the leakage inductance at the output ends 243 of the conductive units 241 are both reduced.

Since a current of large value passes through the path between the connecting parts 34 and the rectifier 31 of the auxiliary circuit board 3, one or more large-area conductors (not shown) may be optionally arranged on the auxiliary circuit board 3 in order to transfer the current of large value and enhance the heat-dissipating efficiency.

Figure 5:
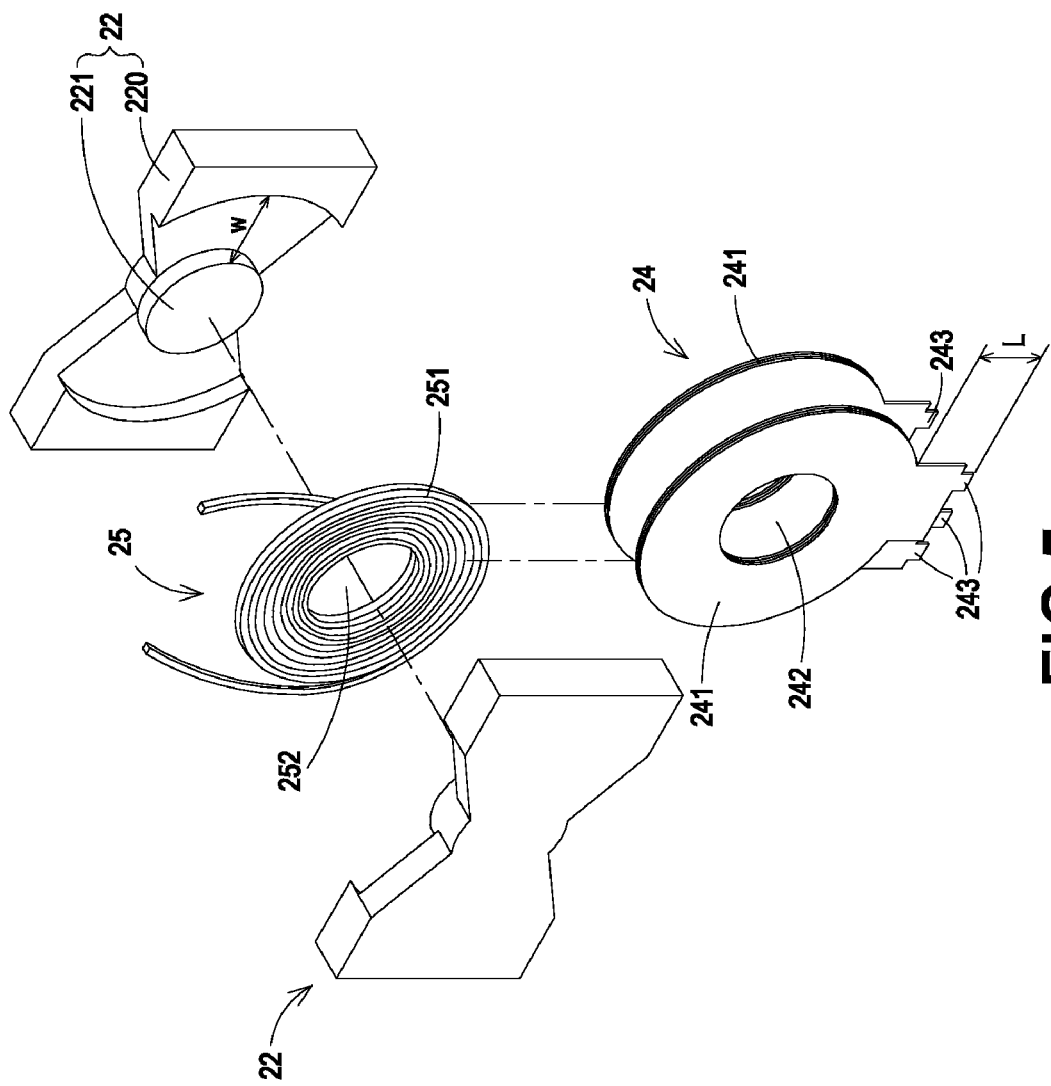
FIG. 5 is a schematic exploded view illustrating a transformer according to another preferred embodiment of the present invention.

FIG. 5 is a schematic exploded view illustrating a transformer according to another preferred embodiment of the present invention. The transformer 2' principally includes a magnetic core assembly 22, a primary winding coil 25 and a secondary winding assembly 24. The magnetic core assembly 22 includes two magnetic parts. In this embodiment, these two magnetic parts of the magnetic core assembly 22 are cooperatively formed as an EE-type core assembly. Each of the two magnetic parts includes a middle portion 221 and a leg portion 220. The secondary winding assembly 24 is a conductive winding module. The conductive winding module 24 is composed of multiple conductive units 241. In addition, each conductive unit 241 has a central hollow portion 242 and multiple output ends 243. The output ends 243 are separately arranged on the bottom of the conductive unit 241. The length L of each output end 243 is in direct proportion to the distance W between the middle portion 221 and the leg portion 220 of the magnetic core assembly 22. In addition, the length L of each output end 243 is smaller than the triple of the distance W between the middle portion 221 and the leg portion 220.

In this embodiment, the primary winding coil 25 is a coil pancake by winding a conductive wire 251. The profile of the primary winding coil 25 is similar to that of the conductive unit 241 of the conductive winding module 24. That is, the primary winding coil 25 is a circular coil pancake having a central hollow portion 252.

Figure 6:
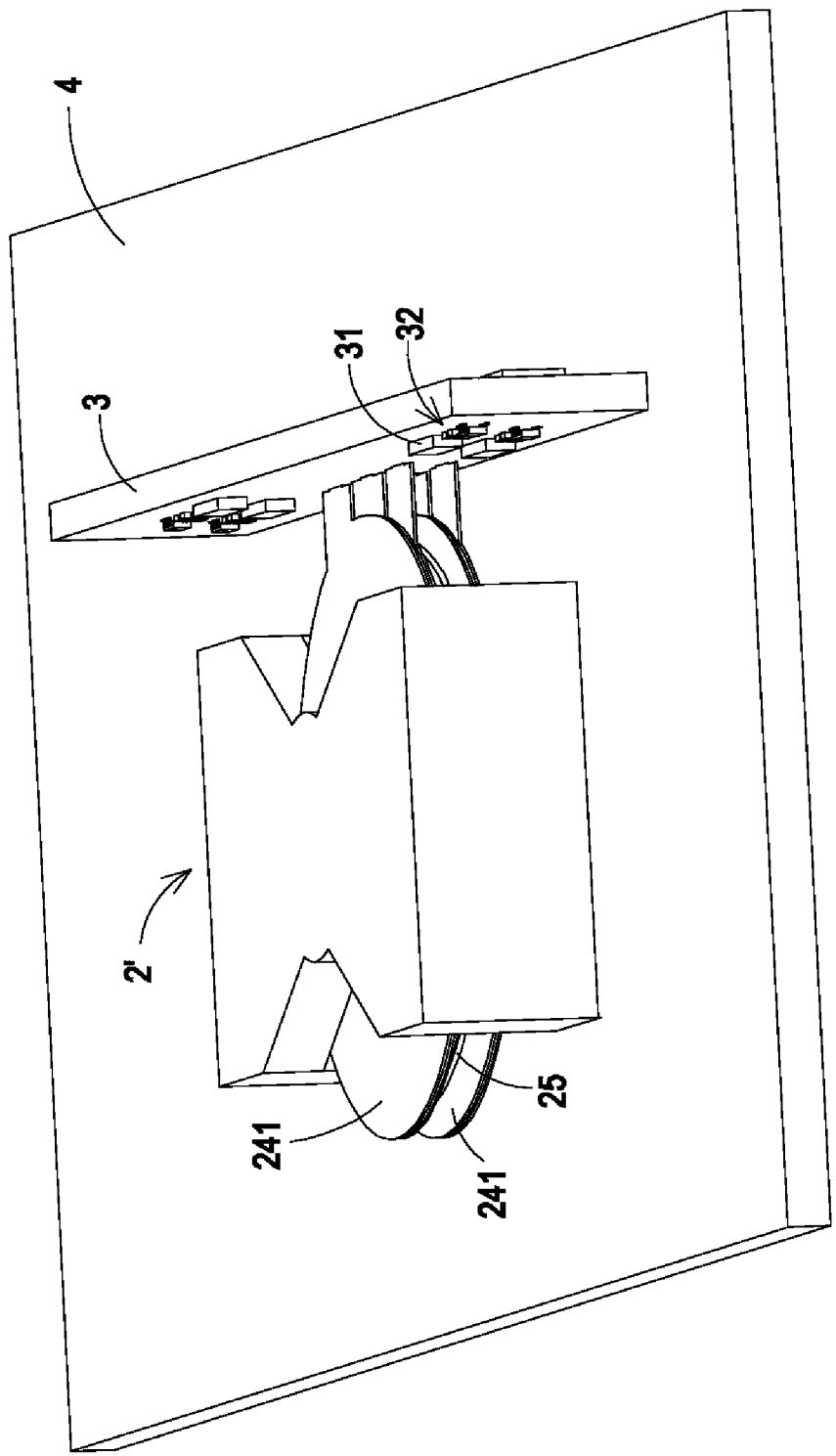
FIG. 6 is a schematic perspective view illustrating an assembly structure of the transformer and the system circuit board shown in FIG. 5 and the auxiliary circuit board shown in FIG. 3.

Hereinafter, a process of assembling the transformer 2' will be illustrated with reference to FIG. 5. First of all, two conductive units 241 of the conductive winding module 24 are arranged on bilateral sides of the primary winding coil 25 such that the hollow portion 252 of the primary winding coil 25 is aligned with the hollow portions 242 of the conductive units 241. Next, the middle portions 221 of the magnetic core assembly 22 are partially embedded into the hollow portions 242 of the conductive units 241 and the hollow portion 252 of the primary winding coil 25. As a consequence, the conductive winding module 24 and the primary winding coil 25 are sheathed around the middle portions 221 of the magnetic core assembly 22; and the conductive winding module 24 and the primary winding coil 25 are sheltered by the leg portions 220 of the magnetic core assembly 22. The resulting structure of the transformer 2' is schematically shown in FIG. 6. As a result, the primary winding coil 25 and the conductive winding module 24 interact with the magnetic core assembly 22 to achieve the purpose of voltage regulation. In some embodiments, after the primary winding coil 25, the magnetic core assembly 22 and the conductive winding module 24 are assembled into the transformer 2', an insulation tape (not shown) may be wound around the outer periphery of the transformer 2 so as to securely combine the primary winding coil 25, the magnetic core assembly 22 and the conductive winding module 24 together.

FIG. 6 is a schematic perspective view illustrating an assembly structure of the transformer and the system circuit board shown in FIG. 5 and the auxiliary circuit board shown in FIG. 3. Hereinafter, a process of fabricating the assembly structure of the transformer 2', the system circuit board 4 and the auxiliary circuit board 3 will be illustrated with reference to FIGS. 3, 5 and 6. First of all, the output ends 243 of the conductive units 241 of the transformer 2' are inserted into corresponding connecting parts 34 of the auxiliary circuit board 3 such that the transformer 2 is electrically connected to the rectifier 31 of the auxiliary circuit board 3. Consequently, the distance between the auxiliary circuit board 3 and the transformer 2' is equal to or smaller than the length L of the output end 243. Next, the conductive terminals 33 of the auxiliary circuit board 3 are inserted into corresponding holes (not shown) of the system circuit board 4 so that the auxiliary circuit board 3 is vertically mounted on the system circuit board 4. In addition, the outlet terminals (not shown) of the primary winding coil 23 are connected to a system circuit board 4 for receiving an input voltage. As such, a sensing voltage outputted from the transformer 2' is directly transmitted to the rectifier 31 of the auxiliary circuit board 3 so as to be rectified and filtered by the rectifier 31. Since the auxiliary circuit board 3 is vertically mounted on the system circuit board 4, the output ends 243 of the conductive units 241 of the transformer 2' can be directly inserted into corresponding connecting parts 34 of the auxiliary circuit board 3 without the need of using a solder material. Since the distance between the auxiliary circuit board 3 and the transformer 2' is equal to or smaller than the length L of the output end 243, the conductive path between the output end 243 of the conductive units 241 and the auxiliary circuit board 3 is shortened. Under this circumstance, the power loss and the leakage inductance at the output ends 243 of the conductive units 241 are both reduced.

Since a current of large value passes through the path between the connecting parts 34 and the rectifier 31 of the auxiliary circuit board 3, one or more large-area conductors (not shown) may be optionally arranged on the auxiliary circuit board 3 in order to transfer the current of large value and enhance the heat-dissipating efficiency.

From the above description, the rectifier is arranged on the auxiliary circuit board and the auxiliary circuit board is vertically mounted on the system circuit board. As such, the output ends of the conductive units of the transformer can be directly inserted into corresponding connecting parts 34 of the auxiliary circuit board without the need of using a solder material. Moreover, since the conductive path between the output end of the conductive units and the auxiliary circuit board is shortened, the power loss and the leakage inductance at the output ends of the conductive units are both reduced. In addition, one or more large-area conductors may be optionally arranged on the auxiliary circuit board in order to transfer the current of large value and enhance the heat-dissipating efficiency.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An assembly structure comprising:
    a transformer comprising a primary winding coil, a secondary winding assembly and a magnetic core assembly, wherein said magnetic core assembly is partially embedded within said primary winding coil and said secondary winding assembly, and said secondary winding assembly has multiple output ends;
    a system circuit board connected to said primary winding coil; and
    an auxiliary circuit board vertically mounted on said system circuit board and having multiple connecting parts, wherein said output ends of said secondary winding assembly of said transformer are connected with corresponding connecting parts of said auxiliary circuit board.

2. The assembly structure according to claim 1 wherein said transformer further comprises a bobbin having a bobbin body and a channel, and said primary winding coil is wound around said bobbin body.

3. The assembly structure according to claim 2 wherein said secondary winding assembly is a conductive winding module including multiple conductive units, wherein said conductive units have respective hollow portions and said output ends, and said hollow portions are aligned with said channel of said bobbin such that said magnetic core assembly is partially embedded into said hollow portions of said conductive units and said channel of said bobbin.

4. The assembly structure according to claim 3 wherein said bobbin body has multiple receiving portions for receiving said conductive units.

5. The assembly structure according to claim 1 wherein said primary winding coil is a coil pancake.

6. The assembly structure according to claim 1 wherein said magnetic core assembly comprises a middle portion and a leg portion, and the length of each output end is smaller than the triple of a distance between said middle portion and the leg portion.

7. The assembly structure according to claim 1 wherein at least one rectifier and a driving circuit are mounted on said auxiliary circuit board, and said auxiliary circuit board has a conductive terminal on an edge thereof such that said auxiliary circuit board is connected to said system circuit board by said conductive terminal.

8. The assembly structure according to claim 1 wherein said connecting parts of said auxiliary circuit board are insertion slots and said output ends of said secondary winding assembly are inserted into corresponding insertion slots.

9. The assembly structure according to claim 1 wherein a distance between said auxiliary circuit board and said transformer is equal to or smaller than the length of said output end.

* * * * *